(12) United States Patent
Toyozawa

(10) Patent No.: US 9,463,938 B2
(45) Date of Patent: Oct. 11, 2016

(54) SUBSTRATE HEAT TREATMENT DEVICE

(75) Inventor: Akihiro Toyozawa, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 902 days.

(21) Appl. No.: 13/592,536

(22) Filed: Aug. 23, 2012

(65) Prior Publication Data

US 2013/0052599 A1 Feb. 28, 2013

(30) Foreign Application Priority Data

Aug. 29, 2011 (JP) ................. 2011-185710

(51) Int. Cl.
| | |
|---|---|
| F27D 15/02 | (2006.01) |
| B65G 49/07 | (2006.01) |
| F27B 17/00 | (2006.01) |
| H01L 21/67 | (2006.01) |
| H01L 21/677 | (2006.01) |

(52) U.S. Cl.
CPC ........... *B65G 49/07* (2013.01); *F27B 17/0025* (2013.01); *H01L 21/67109* (2013.01); *H01L 21/67748* (2013.01)

(58) Field of Classification Search
CPC .............. B65D 49/07; F27B 17/0025; H01L 21/67748
USPC .......... 432/77, 219, 253, 258, 259; 219/228, 219/443.1
See application file for complete search history.

(56) References Cited

U.S. PATENT DOCUMENTS

| | | | | |
|---|---|---|---|---|
| 5,015,177 A | * | 5/1991 | Iwata | G03F 7/00 432/121 |
| 6,045,315 A | * | 4/2000 | Azumano et al. | 414/217 |
| 2006/0194445 A1 | * | 8/2006 | Hayashi et al. | 438/758 |
| 2007/0068920 A1 | * | 3/2007 | Kang et al. | 219/444.1 |
| 2009/0098297 A1 | * | 4/2009 | Sakai et al. | 427/314 |

FOREIGN PATENT DOCUMENTS

| | | |
|---|---|---|
| JP | 2001-274232 A | 10/2001 |
| JP | 2007-096243 A | 4/2007 |
| JP | 2010-232415 A | 10/2010 |

\* cited by examiner

*Primary Examiner* — Alissa Tompkins
*Assistant Examiner* — Benjamin W Johnson
(74) *Attorney, Agent, or Firm* — Pearne & Gordon LLP

(57) ABSTRACT

A substrate heat treatment device includes: a heating plate that mounts a wafer and performs a heat treatment on the wafer; a substrate transfer arm that transfers the wafer to the heating plate and is movable from and toward the heating plate; a transfer arm moving device that moves the substrate transfer arm between a position above the heating plate and a standby position of the substrate transfer arm apart from the heating plate; a substrate transfer device that transfers the wafer to and from the substrate transfer arm located at the standby position. The substrate heat treatment device further includes a cooling arm serving as a substrate holding unit configured to cool a previously heat-treated wafer by the heating plate and transfer a next wafer to the heating plate while the previously heat-treated wafer is transferred to the substrate transfer device.

3 Claims, 14 Drawing Sheets

W : WAFER
61 : TRANSFER ARM
65 : ARM LIFTING PIN
65b : ELEVATION DRIVING UNIT
66 : HEATING PLATE LIFTING PIN
66b : ELEVATION DRIVING UNIT
70 : HEATING PLATE
80 : COOLING ARM
100 : CONTROLLER

85 : RETREAT BUFFER
86 : BUFFER ELEVATION DRIVING UNIT
87 : COOLING DEVICE
90 : HOLDING DEVICE

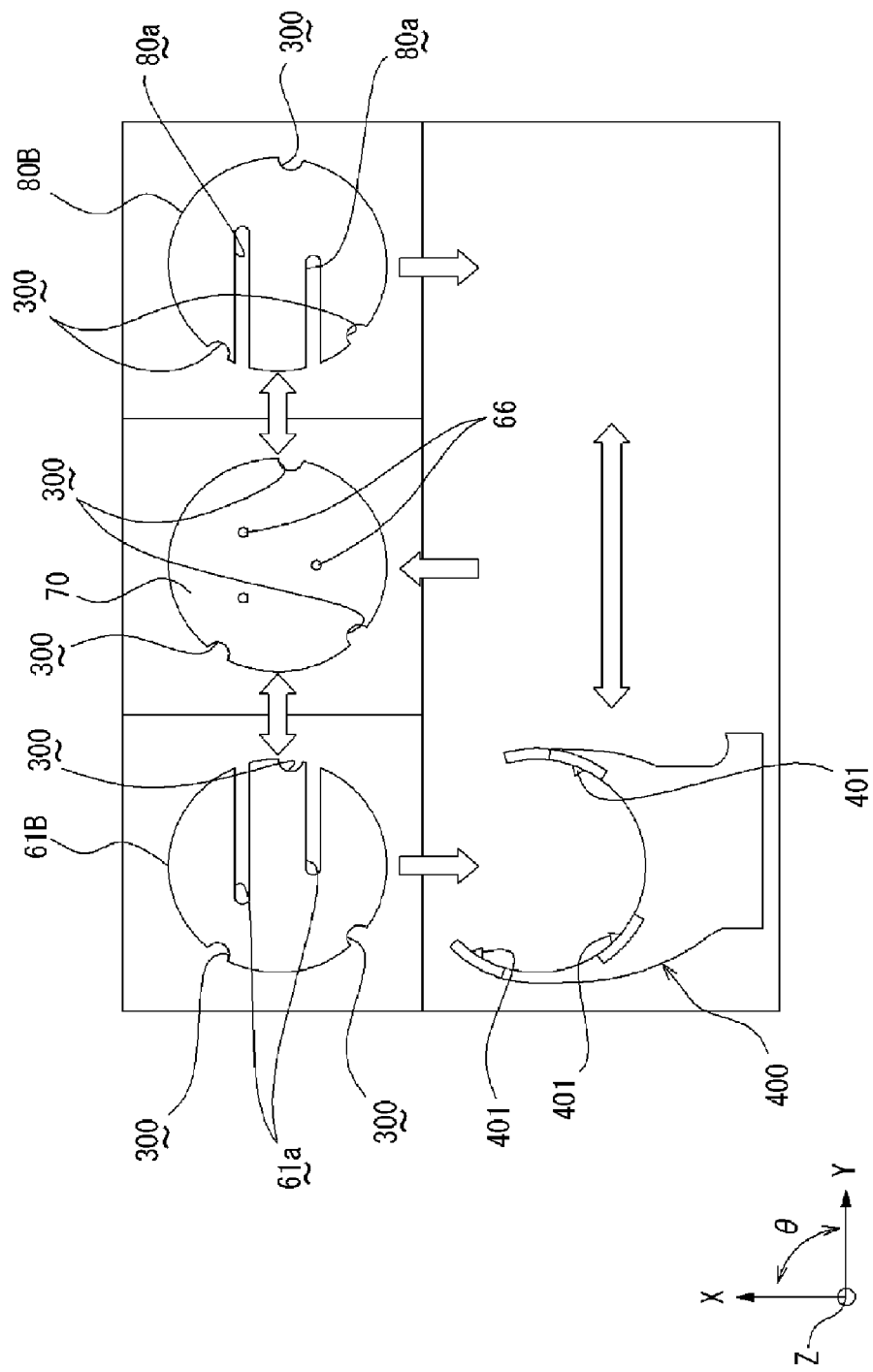

SUBSTRATE HEAT TREATMENT DEVICE

CROSS-REFERENCE TO RELATED APPLICATION

This application claims the benefit of Japanese Patent Application No. 2011-185710 filed on Aug. 29, 2011, the disclosures of which are incorporated herein by reference.

FIELD OF THE INVENTION

The present disclosure relates to a substrate heat treatment device.

BACKGROUND OF THE INVENTION

In a photolithography process, when manufacturing a semiconductor device, a resist pattern is formed on, e.g., a semiconductor wafer (hereinafter, simply referred to as a "wafer") by performing a resist coating process, an exposure process, and a developing process in sequence. In the resist coating process, by coating a resist solution on the wafer, a resist film is formed on the wafer. In the exposure process, the resist film is exposed to light through a pattern, and in the developing process, the exposed resist film is developed.

In this photolithography process, various heat treatments are performed. Such heat treatments include a heat treatment (prebake) performed after the resist coating process, a heat treatment (post-exposure bake) performed after the exposure process, a heat treatment (post bake) performed after the developing process, and so forth.

In the heat treatments, the wafer is heated to a preset temperature ranging from, e.g., about 100° C. to about 350° C. In order to perform a subsequent process, the heated wafer needs to be cooled to a room temperature (e.g., about 23° C.). Therefore, a heat treatment device includes a heating plate for heating the wafer, a cooling plate for cooling the heated wafer, and a transfer device for transferring the wafer between the heating plate and the cooling plate.

As the transfer device for transferring the wafer between the heating plate and the cooling plate, there is known a structure having a movable cooling plate that is configured to receive the wafer transferred by an external substrate transfer device, transfer the received wafer to the heating plate, receive the heated wafer from the heating plate, and cool the heated wafer (see, for example, Patent Document 1).

Further, as another transfer device for transferring the wafer between the heating plate and the cooling plate, there is known a structure having two transfer arms for transferring the wafer between the heating plate and the cooling plate that are fixed (see, for example, Patent Document 2).

Patent Document 1: Japanese Patent Laid-open Publication No. 2010-232415

Patent Document 2: Japanese Patent Laid-open Publication No. 2007-096243

In Patent Document 1, however, one cooling plate corresponding to one heating plate is provided. A heating time (e.g., about 60 seconds) for the wafer on the heating plate is longer than a cooling time (e.g., about 15 seconds) for the wafer on the cooling plate. Accordingly, there exists a certain period during which the cooling process is not performed on the cooling plate. As a result, an operation rate and a throughput of the heat treatment device may be reduced.

Further, in Patent Document 2, the wafer is transferred between the heating plate and the cooling plate by using the two transfer arms. Since, however, the heated wafer is transferred to the cooling plate and the transferred wafer is cooled on the cooling plate and taken out of the heat treatment device, it is time-consuming. As a result, the operating rate and the throughput of the heat treatment device may also be reduced.

BRIEF SUMMARY OF THE INVENTION

In view of the foregoing, illustrative embodiments provide a substrate heat treatment device configured to cool a substrate during a heat treatment. Thus, the operation efficiency of the substrate heat treatment device can be improved.

In accordance with one aspect of an illustrative embodiment, there is provided a substrate heat treatment device. The substrate heat treatment device includes a heating plate that mounts thereon a substrate and performs a heat treatment on the substrate; a substrate transfer arm that transfers the substrate to the heating plate and is movable from and toward the heating plate; an arm moving device that moves the substrate transfer arm between a position above the heating plate and a standby position of the substrate transfer arm apart from the heating plate; a substrate transfer device that transfers the substrate to and from the substrate transfer arm located at the standby position of the substrate transfer arm. The substrate heat treatment device further includes a substrate holding unit configured to cool a previously heat-treated substrate by the heating plate and transfer a next substrate to the heating plate while the previously heat-treated substrate is transferred to the substrate transfer device.

With this configuration, the substrate transfer arm receives the substrate from the substrate transfer device and transfers the received substrate to the heating plate. Then, while the substrate previously heat-treated by the heating plate is transferred to the substrate transfer device, the substrate holding unit temporarily mounts thereon the previously heat-treated substrate and cools the previously heat-treated substrate. Then, the substrate transfer arm may transfer the next wafer to the heating plate.

The substrate transfer arm may be configured to cool the substrate. Further, the substrate holding unit may be formed of a substrate cooling arm configured to transfer the substrate to and from the substrate transfer device and the heating plate and cool the substrate received from the heating plate. Here, the heat treatment device may further include a heating plate lifting pin configured to be protruded above and retracted below a surface of the heating plate and configured to be capable of transferring the substrate to and from the substrate transfer arm and the substrate cooling arm; and an elevation driving unit configured to move up and down the heating plate lifting pin. The heating plate lifting pin and the elevation driving unit may be provided at a region where the heating plate is located, and the substrate cooling arm may be disposed above the substrate transfer arm so as to be movable between a position above the heating plate and a position above the standby position of the substrate transfer arm by a cooling arm moving device.

With this configuration, the substrate transfer arm receives the substrate from the substrate transfer device and transfers the received substrate to the heating plate. Then, while the substrate previously heat-treated by the heating plate is transferred to the substrate transfer device, the receiving operation of the previously heat-treated substrate from the heating plate by the substrate transfer arm and the transferring operation of the next substrate to the heating plate by the substrate cooling arm serving as the substrate holding unit can be performed consecutively. The previously heat-treated substrate is transferred to the substrate transfer device after cooled by the substrate transfer arm having the cooling operation, and the next substrate heat-treated by the heating plate can be transferred to the transfer device after cooled by the cooling arm.

The substrate holding unit may be formed of a substrate cooling arm configured to transfer the substrate to and from the substrate transfer arm and cool the substrate received from the substrate transfer arm. Further, the heat treatment device may further include an arm lifting pin configured to be protruded above and retracted below a surface of the substrate transfer arm and configured to be capable of transferring the substrate to and from the substrate cooling arm; a first elevation driving unit configured to move up and down the arm lifting pin; a heating plate lifting pin configured to be protruded above and retracted below a surface of the heating plate and configured to be capable of transferring the substrate to and from the substrate transfer arm; and a second elevation driving unit configured to move up and down the heating plate lifting pin. The arm lifting pin and the first elevation driving unit may be provided at a region where the substrate transfer arm stands by, and the heating plate lifting pin and the second elevation driving unit may be provided at a region where the heating plate is located. The substrate cooling arm may be disposed above the substrate transfer arm so as to be movable between a position above the heating plate and a position above the standby position of the substrate transfer arm by a cooling arm moving device.

With this configuration, the substrate transfer arm receives the substrate from the substrate transfer device and transfers the received substrate to the heating plate. Then, while the substrate previously heat-treated by the heating plate is transferred to the substrate transfer device, the substrate cooling arm serving as the substrate holding unit receives the heat-treated substrate from the substrate transfer arm and temporarily mounts thereon the substrate to cool the heat-treated substrate. While the previously heat-treated substrate is mounted and cooled by the substrate cooling arm, the substrate transfer arm receives the next wafer from the substrate transfer device and transfers the next wafer to the heating plate. Thereafter, the previously heat-treated substrate cooled by the substrate cooling arm is transferred on the substrate transfer arm, and then, transferred to the substrate transfer device.

The substrate transfer arm may be configured to cool the substrate, and the substrate holding unit may be formed of a retreat buffer configured to transfer the substrate to and from the substrate transfer arm and cool the substrate received from the substrate transfer arm. Further, the retreat buffer may be movable up and down between a position above the standby position of the substrate transfer arm and the standby position thereof by a buffer elevation driving unit, and the retreat buffer may include a holding unit configured to hold the substrate detachably when the retreat buffer transfers the substrate to and from the substrate transfer arm.

With this configuration, the substrate transfer arm receives the substrate from the substrate transfer device and transfers the received substrate to the heating plate. Then, while the substrate previously heat-treated by the heating plate is transferred to the substrate transfer device, the substrate transfer arm receives the heat-treated substrate from the heating plate, and the retreat buffer receives the heat-treated substrate from the substrate transfer arm and temporarily holds the heat-treated substrate to cool the substrate. While the previously heat-treated substrate is held and cooled by the retreat buffer, the substrate transfer arm receives the next substrate from the substrate transfer device and transfers the next substrate to the heating plate. Thereafter, the previously heat-treated substrate cooled by the retreat buffer is transferred on the substrate transfer arm, and then, the substrate transfer arm cools the substrate and transfers the substrate to the substrate transfer device.

In accordance with the illustrative embodiments, the substrate transfer arm receives the substrate from the substrate transfer device and transfers the received substrate to the heating plate. Then, while the substrate previously heat-treated by the heating plate is transferred to the substrate transfer device, the substrate holding unit temporarily holds the previously heat-treated substrate and cools the previously heat-treated substrate. Further, the substrate transfer arm may transfer the next substrate to the heating plate. Accordingly, by adding the cooling operation for cooling the substrate during the heat treatment by the heating plate, the operation efficiency can be improved.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 14 is a plane view schematically illustrating a substrate heat treatment device in accordance with a fourth illustrative embodiment.

DETAILED DESCRIPTION OF THE INVENTION

Hereinafter, illustrative embodiments will be described in detail with reference to the accompanying drawings when a substrate heat treatment device in accordance with the illustrative embodiments is applied to a coating and developing apparatus for a semiconductor wafer (hereinafter, simply referred to as a "wafer").

Figure 1:
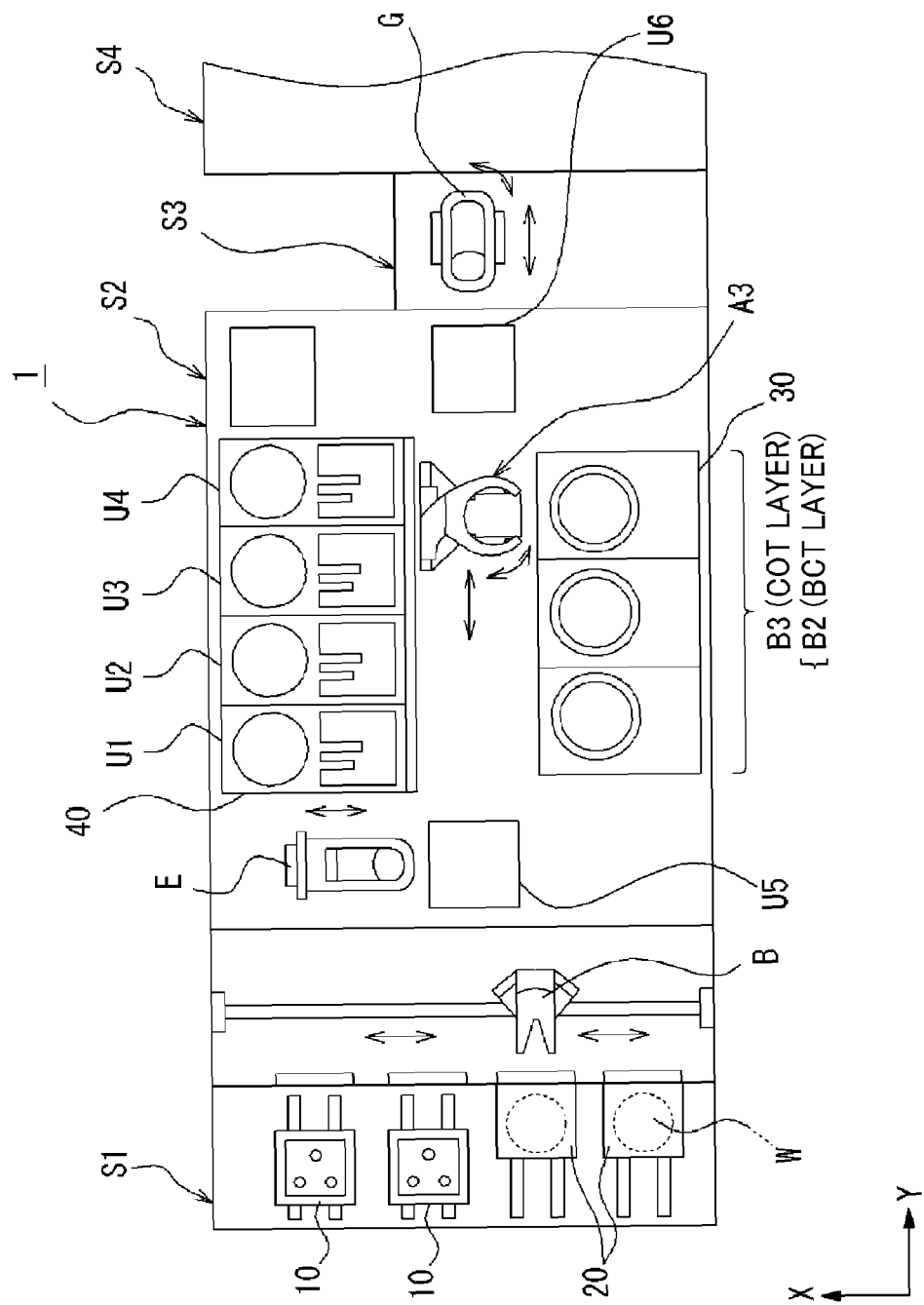
FIG. 1 is a plane view schematically illustrating a coating and developing apparatus including a substrate heat treatment device in accordance with illustrative embodiments.

As depicted in FIG. 1, a coating and developing apparatus 1 includes a carrier block S1, a treatment block S2, an interface block S3, and an exposure device S4, which are connected in this sequence.

In the carrier block S1, a transfer device B takes out a wafer W from a hermetically sealed carrier 20 mounted on a mounting table 10 and transfers the wafer W into the treatment block S2 adjacent to the carrier block S1. Further, the transfer device B receives the wafer W treated in the treatment block S2 and returns the treated wafer W back into the carrier 20.

Figure 2:
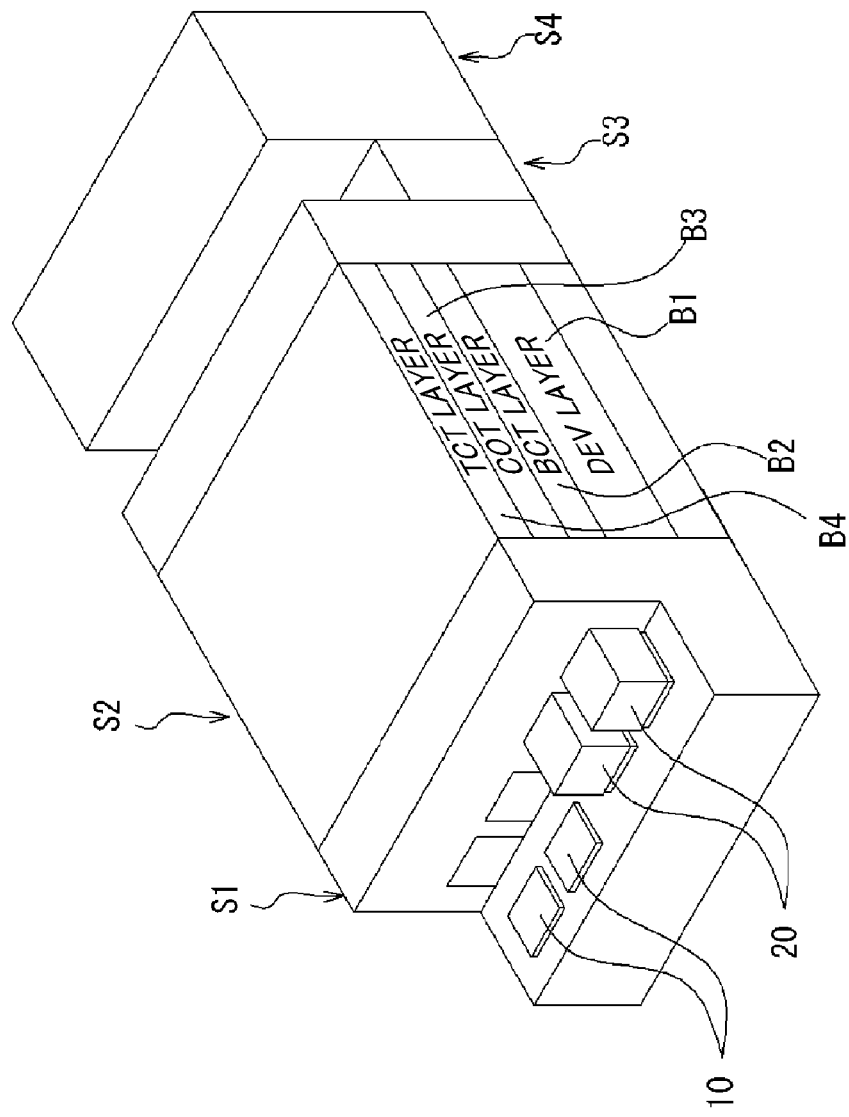
FIG. 2 is a perspective view schematically illustrating the coating and developing apparatus.

The treatment block S2 includes, as illustrated in FIG. 2, a first block (DEV layer) B1 for performing a developing process; a second block (BCT layer) B2 for forming an antireflection film under a resist film; a third block (COT layer) B3 for coating a resist solution; and a fourth block (TCT layer) B4 for forming an antireflection film on the resist film. These first to the fourth blocks (DEV layer) B1 to (TCT layer) B4 are stacked from the bottom of the treatment block S2 in this sequence.

Figure 3:
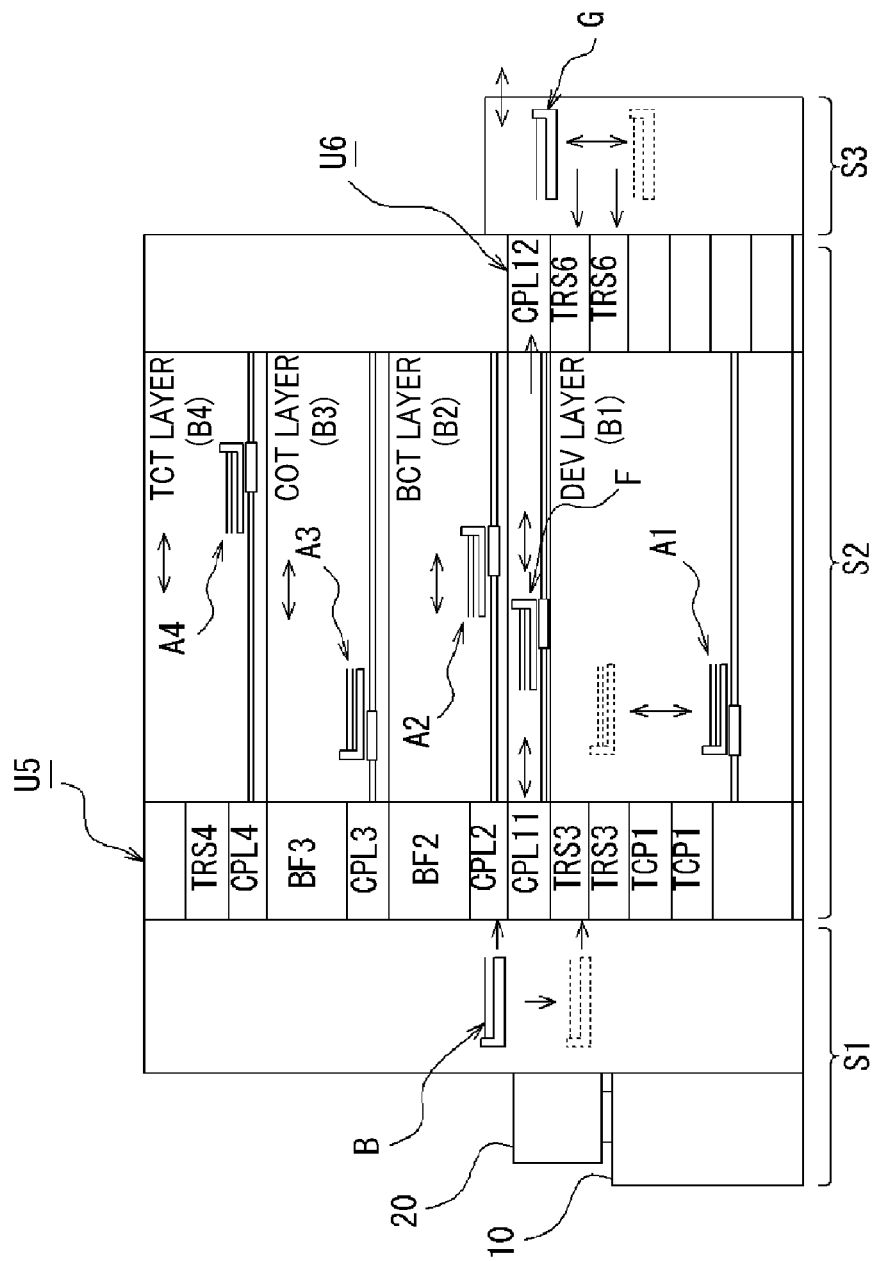
FIG. 3 is a longitudinal cross sectional view schematically illustrating the coating and developing apparatus.

The second block (BCT layer) B2 and the fourth block (TCT layer) B4 include a liquid processing module 30, a heating and cooling unit group 40, and transfer devices A2 and A4, respectively. The liquid processing module 30 includes three coating units for coating a chemical liquid for forming the antireflection film by a spin coating. The heating and cooling unit group 40 performs a pre-treatment and a post-treatment before and after the coating process performed by the liquid processing module 30. Each of the transfer devices A2 and A4 is provided between the liquid processing module 30 and the heating and cooling unit group 40 including a substrate heat treatment device in accordance with the illustrative embodiments and is configured to transfer the wafer W therebetween (see. FIG. 3).

The third block (COT layer) B3 has the same configuration as those of the second and fourth blocks (BCT layer) B2 and (TCT layer) B4 excepting that the chemical liquid is the resist solution and a hydrophobic unit for performing a hydrophobic process is further provided. Meanwhile, in the first block (DEV layer) B1, for example, two developing units are stacked in a single (DEV layer) B1 in two levels. The first block (DEV layer) B1 also includes a common transfer device A1 configured to transfer the wafer W between the developing units in two levels. In addition, as depicted in FIGS. 1 and 3, a shelf unit U5 is provided in the treatment block S2, and the wafer W is transferred between respective units of the shelf unit U5 by a vertically movable transfer device E that is provided in a vicinity of the shelf unit U5.

In the coating and developing apparatus 1 having the above-described configuration, the wafer W is transferred from the carrier 20 into a certain transfer unit of the shelf unit U5, e.g., a transfer unit CPL2 corresponding to the second block (BCT layer) B2 by the transfer device B. Then, from the transfer unit CPL2, the wafer W is loaded into the third block (COT layer) B3 via the transfer device E, a transfer unit CPL3, and the transfer device A3. Further, the resist film is formed on the wafer W in the liquid processing module 30 after the hydrophobic process is performed on a surface of the wafer W in the hydrophobic unit. Thereafter, the wafer W having thereon the resist film is transferred into a transfer unit BF3 of the shelf unit U5 by the transfer device A3 as a substrate transfer unit.

Afterward, the wafer W is transferred to the transfer device A4 via the transfer unit BF3, the transfer device E, and a transfer unit CPL4 in this sequence. Then, after the antireflection film is formed on the resist film, the wafer W is transferred into a transfer unit TRS4 by the transfer device A4. Here, the antireflection film may not be formed on the resist film. Further, the antireflection film may be formed in the second block (BCT layer) B2 instead of performing the hydrophobic process on the wafer W.

Meanwhile, a shuttle arm F is provided in an upper region of the first block (DEV layer) B1. The shuttle arm F serves as a dedicated transfer unit for directly transferring the wafer W from a transfer unit CPL11 of the shelf unit U5 to a transfer unit CPL12 of a shelf unit U6. The wafer W, on which only the resist film is formed or both the resist film and the antireflection film are formed, is transferred into the transfer unit CPL11 via the transfer unit BF3 or via the transfer unit TRS4 by the transfer device E. Then, the wafer W is directly transferred into the transfer unit CPL12 of the shelf unit U6 by the shuttle arm F and introduced into the interface block S3. Further, though not shown, there may be additionally provided a periphery exposure module for exposing a periphery of the wafer W before the wafer W is introduced into the interface block S3.

Then, the wafer W is transferred into the exposure device S4 by an interface arm G. After an exposure process is performed in the exposure device S4, the wafer W is transferred into a transfer unit TRS6 of the shelf unit U6 and then returned back into the treatment block S2. Then, a developing process is performed on this wafer W in the first block (DEV layer) B1 and transferred into the transfer unit TRS3 by the transfer device A1 as the substrate transfer unit.

Thereafter, the wafer W is returned back into the carrier 20 by the transfer device B. In FIG. 1, U1 to U4 denote heating and cooling unit groups, and each of U1 to U4 includes the substrate heat treatment device in accordance with the illustrative embodiments in which a heating unit and a cooling unit are stacked on top of each other.

Now, a heat treatment device to which a substrate heat treatment device in accordance with the illustrative embodiment is applied will be described in detail with reference to FIGS. 4 to 13.

First Illustrative Embodiment

Figure 4:
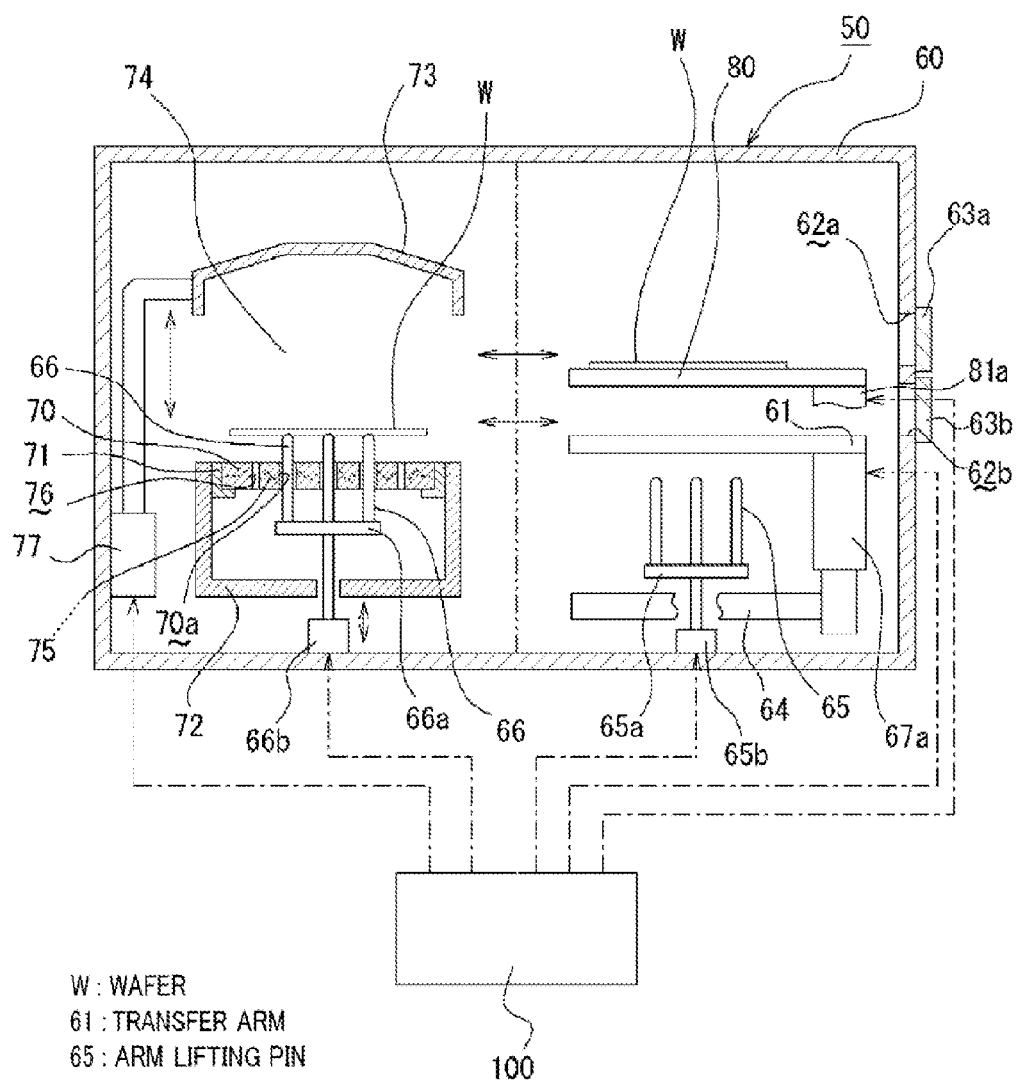
FIG. 4 is a longitudinal cross sectional view schematically illustrating the substrate heat treatment device in accordance with a first illustrative embodiment.
Figure 5:
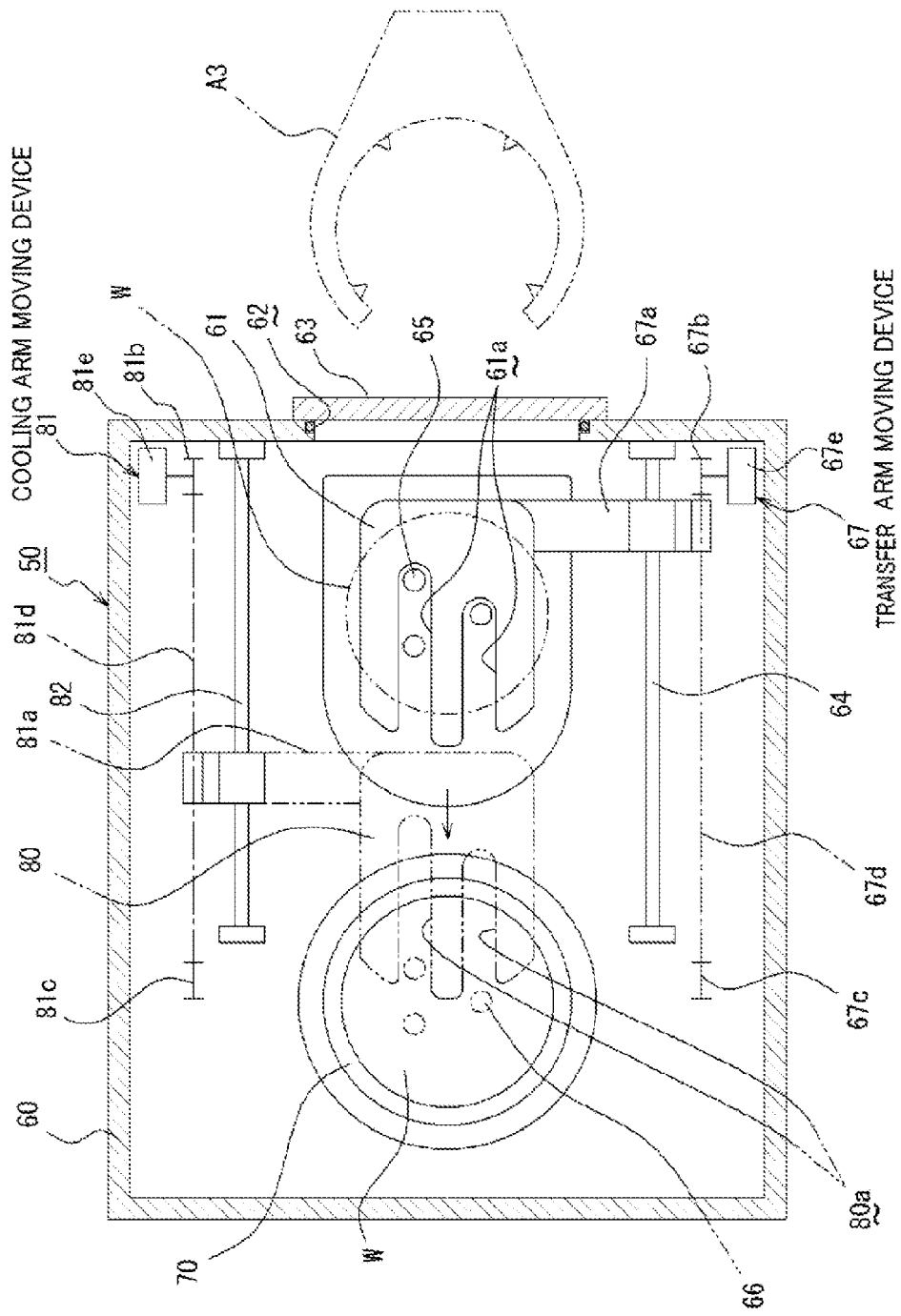
FIG. 5 is a transversal cross sectional view schematically illustrating the substrate heat treatment device in accordance with the first illustrative embodiment.

Referring to FIGS. 4 and 5, a heat treatment device 50 in accordance with a first illustrative embodiment includes a housing 60 capable of being opened and closed, a heating plate 70, a transfer arm 61, and a substrate cooling arm 80 (hereinafter, simply referred to as a cooling arm), and the heating plate 70, the transfer arm 61, and the cooling arm 80 are accommodated in the housing 60. The heating plate 70 mounts thereon a wafer W and heats the wafer W to a preset temperature of, e.g., about 100° C. to about 350° C. The transfer arm 61 mounts thereon the wafer W and cools the wafer W to a certain temperature, e.g., about 23° C. and is configured to be movable relatively to the heating plate 70. The cooling arm 80 serving as a substrate holding unit is configured to cool the wafer W previously heat-treated by the heating plate 70 and transfers a next wafer W to the heating plate 70 while the previously heat-treated wafer W is transferred to a substrate transfer device, e.g., the transfer device A3.

Further, two loading/unloading openings, i.e., an upper loading/unloading opening 62a and a lower loading/unloading opening 62b for the wafer W are provided in a sidewall of the housing 60 adjacent to the transfer arm 61 while spaced apart from each other with a certain gap. Shutters 63a and 63b are provided at the loading/unloading openings 62a and 62b, respectively, to open and close the loading/unloading openings 62a and 62b, respectively, by a non-illustrated opening/closing driving device. Further, in this illustrative embodiment, although the two loading/unloading openings 62a and 62b and the two shutters 63a and 63b are provided in the sidewall of the housing 60, only one loading/unloading opening and only one shutter corresponding thereto may be provided.

As shown in FIG. 5, for example, the transfer arm 61 has a substantially rectangular shape and its side surface facing the heating plate 70 has an arc shape gently curved protrudingly toward the heating plate 70. Within the transfer arm 61, for example, a non-illustrated cooling flow passage for allowing a coolant to flow therethrough is included, and the transfer arm 61 is controlled to be at a certain cooling temperature, e.g., about 23° C. by the cooling flow passage. As shown in FIG. 5, for example, a rail 64 extended in an X direction is provided at a side of the transfer arm 61. The transfer arm 61 is configured to be moved along the rail 64 by a transfer arm moving device 67 while being moved to/from a position above the heating plate 70 forward and backward.

In this case, as depicted in FIG. 5, a bracket 67a, which is protruded at a base end portion of the transfer arm 61, is slidably provided at the rail 64. The bracket 67a is connected to a timing belt 67d provided between a driving pulley 67b and a driven pulley 67c that constitute the transfer arm moving device 67. By rotating the driving pulley 67b forward and backward by a driving motor 67e, the transfer arm 61 can be reciprocated between the position above the heating plate 70 and a standby position of the transfer arm 61 beside the heating plate 70. Further, the transfer arm moving device 67 may be formed of a ball screw unit instead of the timing belt unit.

The transfer arm 61 has two slits 61a, as shown in FIG. 5. The slits 61a are extended from an end portion of the transfer arm 61 at the side of the heating plate 70 toward a central portion of the transfer arm 61. The slits 61a allow the transfer arm 61 not to interfere with heating plate lifting pins 66 when the transfer arm 61 is moved to the position above the heating plate 70.

Under the slits 61a of the transfer arm 61 located at the standby position, as shown in FIG. 4, there are provided vertically movable arm lifting pins 65. By moving up and down a holding member 65a for holding lower end portions of the arm lifting pins 65 by an elevation driving unit 65b, the wafer W is moved up and down from the transfer arm 61 or from the cooling arm 80. As a result, the wafer W can be transferred between the transfer arm 61 and the transfer device A3 or between the cooling arm 80 and the transfer device A3.

The cooling arm 80 has the same configuration as that of the transfer arm 61. By way of example, as shown in FIG. 5, the cooling arm 80 has the substantially rectangular shape and its side surface facing the heating plate 70 has an arc shape gently curved protrudingly toward the heating plate 70. Within the cooling arm 80, for example, the non-illustrated cooling flow passage for allowing the coolant to flow therethrough is included, and the cooling arm 80 is controlled to be at the certain cooling temperature, e.g., about 23° C. by the cooling flow passage. As shown in FIG. 5, for example, a rail 82 extended in the X direction is provided at the side of the cooling arm 80. The cooling arm 80 is configured to be moved along the rail 82 by a cooling arm moving device 81 while being moved to/from the position above the heating plate 70 forward and backward.

In this case, as depicted in FIG. 5, a bracket 81a, which is protruded at a base end portion of the cooling arm 80, is slidably provided at the rail 82. The bracket 81a is connected to a timing belt 81d provided between a driving pulley 81b and a driven pulley 81c that constitute the cooling arm moving device 81. By rotating the driving pulley 81b forward and backward by a driving motor 81e, the cooling arm 80 can be reciprocated between the position above the heating plate 70 and the standby position of the cooling arm 80 beside the heating plate 70. Further, the cooling arm moving device 81 may be formed of the ball screw unit instead of the timing belt unit.

The cooling arm 80 has two slits 80a, as the same as the transfer arm 61, as shown in FIG. 5. The slits 80a are extended from an end portion of the cooling arm 80 at the side of the heating plate 70 toward a central portion of the cooling arm 80. The slits 80a allow the cooling arm 80 not to interfere with the heating plate lifting pins 66 when the cooling arm 80 is moved to the position above the heating plate 70.

Meanwhile, as shown in FIG. 4, the heating plate 70 is placed in a top opening of a cup-shaped heating plate accommodating member 72 and held on a supporting ring 71. A processing space 74 defined by the supporting ring 71 and a cover body 73 is formed above the heating plate 70. The cover body 73 is vertically movable by a cover body elevating device 77.

The heating plate 70 has a disk shape having a certain thickness, and a heater 75 is embedded in a bottom portion of the heating plate 70. The heater 75 generates heat by applying power thereto. The heating plate 70 can be adjusted to a certain temperature ranging, e.g., from about 100° C. to about 350° C. by the heater 75.

Further, a multiple number of proximity pins (not shown) for supporting the wafer W is provided on a top surface, i.e., a wafer mounting surface of the heating plate 70. By the proximity pins, a small gap is formed between the wafer W and the heating plate 70, and the wafer W can be heated by radiant heat from the heating plate 70 in a non-contact way. Furthermore, a multiple number of heating plate lifting pins 66 for supporting an outer periphery of the wafer W is provided at an outer periphery portion of the wafer mounting surface of the heating plate 70. The heating plate lifting pins 66 guide the wafer W to the proximity pins so as to prevent position deviation of the wafer W.

A multiple number of, e.g., three through holes 70a are formed through the heating plate 70 in a vertical direction. The heating plate lifting pins 66 are respectively inserted through the through holes 70a to be movable up and down. By moving up and down a holding member 66a for holding bottom end portions of the heating plate lifting pins 66 by an elevation driving unit 66b, the heating plate lifting pins 66 can be protruded above and retracted below the wafer mounting surface of the heating plate 70, while supporting the wafer W thereon. By the elevation driving unit 66b, the heating plate lifting pins are protruded above and retracted below the wafer mounting surface of the heating plate 70, and, further, the wafer W is transferred to/from the transfer arm 61 or the cooling arm 80 that is located at the position above the heating plate 70.

Moreover, the heating plate 70 has suction holes 76 that are arranged on a circle, for example, as depicted in FIG. 4. The suction holes 76 are formed through the heating plate 70 in the vertical direction. A suction device such as a vacuum pump (not shown) is connected to the suction holes 76 at the bottom portion of the heating plate 70 via non-illustrated suction tubes.

In the heat treatment device 50 having the above-described configuration, the transfer arm moving device 67, the cooling arm moving device 81, the elevation driving unit 65b for the arm lifting pins 65, the elevation driving unit 66b for the heating plate lifting pins 66, the cover body elevating device 77, and the shutters 63a and 63b are electrically connected to a controller 100 as a control unit, and operations thereof are controlled in response to control signals based on programs stored in the controller 100.

Further, in the above-described first illustrative embodiment, for the purpose of easy understanding of the structures of the transfer arm moving device 67 and the cooling arm moving device 81 in FIG. 5, the transfer arm moving device 67 and the cooling arm moving device 81 are shown to be positioned to face each other. However, since it is generally desirable to position the driving sources on the same side, the transfer arm moving device 67 and the cooling arm moving device 81 may be located on the same side.

Figure 6:
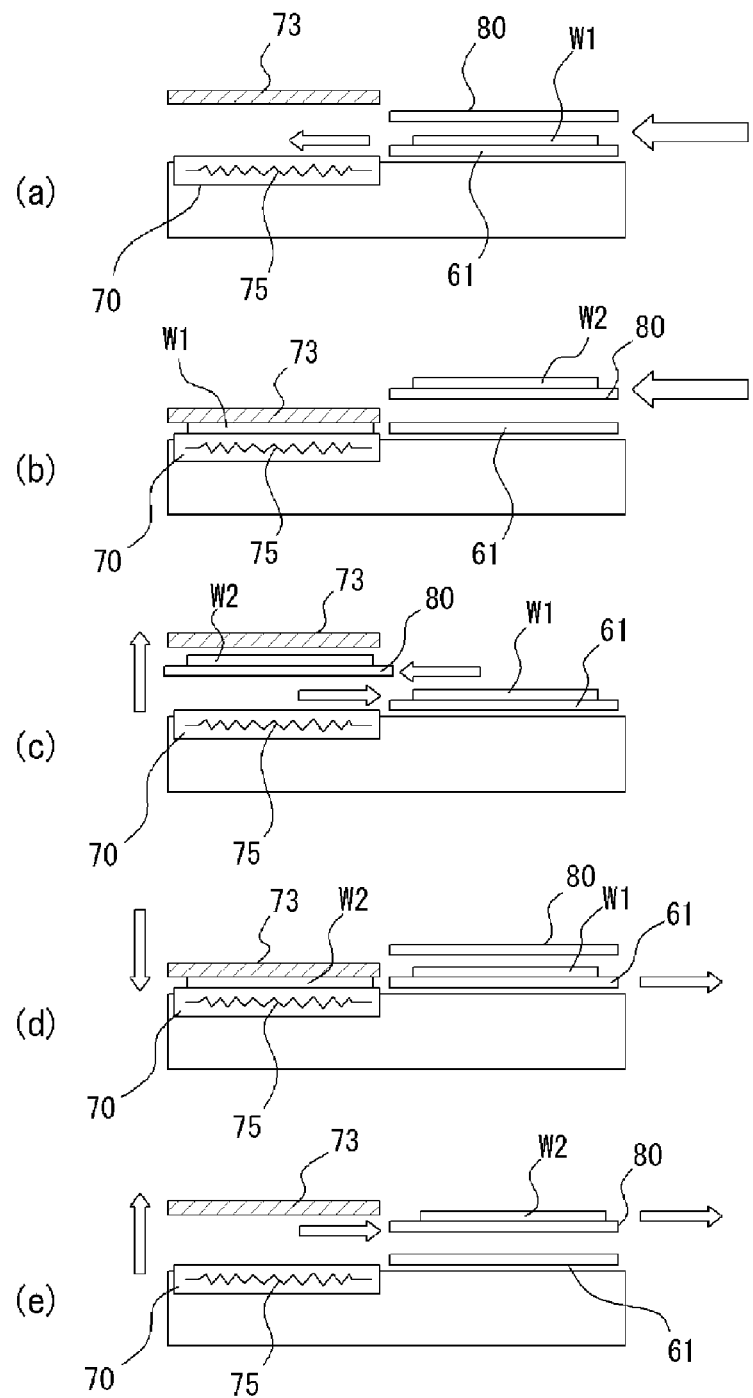
FIG. 6 is a side view schematically illustrating an operation of the substrate heat treatment device in accordance with the first illustrative embodiment.

Now, an operation of the heat treatment device 50 in accordance with the first illustrative embodiment will be described in detail with reference to FIG. 6. First, a wafer W1 is transferred to a position above the transfer arm 61 located at the standby position by a transfer device (not shown) that enters into the heat treatment device 50 through the lower loading/unloading opening 62b (see FIG. 4). Then, the transfer arm 61 receives the wafer W1 (see FIG. 6(a)). Subsequently, the transfer arm 61 is moved to a position above the heating plate 70, and the heating plate lifting pins 66 are moved up and receive the wafer W1 from the transfer arm 61. Then, the transfer arm 61 is retreated, and the heating plate lifting pins 66 are moved down so that the wafer W1 is mounted on the heating plate 70. After the transfer arm 61 that has transferred the wafer W1 to the heating plate 70 is retreated to the standby position, the cover body 73 is moved down and the wafer W1 is heat-treated. At this time, a next wafer W2 is transferred to a position above the cooling arm 80 located at a standby position by a transfer device (not shown) that enters into the heat treatment device 50 through the upper loading/unloading opening 62a (see FIG. 4). Then, the cooling arm 80 receives the next wafer W2 (see FIG. 6(b)).

Upon the completion of the heat treatment by the heating plate 70, the cover body 73 is moved up. The heating plate lifting pins 66 are moved up and the heat-treated wafer W1 is transferred on the transfer arm 61 that is moved to the position above the heating plate 70. The transfer arm 61 receives the heat-treated wafer W1 and then is moved to the standby position. At the same time, the cooling arm 80 mounting thereon the next wafer W2 is moved to the position above the heating plate 70 so that the next wafer W2 is located at the position above the heating plate (see FIG. 6(c)). Thereafter, the heating plate lifting pins 66 are moved up and receive the next wafer W2 from the cooling arm 80. Then, after the cooling arm 80 is retreated, the heating plate lifting pins 66 are moved down to transfer the next wafer W2 to the heating plate 70. Thereafter, the cover body 73 is moved down, and the next wafer W2 is heat-treated by the heating plate 70. While the next wafer W2 is heat-treated by the heating plate 70, the previously heated wafer W1 is cooled by a cooling operation of the transfer arm 61. Then, the wafer W1 is transferred to the transfer device (not shown) from the transfer arm 61 and collected (see FIG. 6(d)).

After the next wafer W2 is heat-treated by the heating plate 70, the heating plate lifting pins 66 are moved up. Then, the next wafer W2 is transferred on the cooling arm 80 that is moved to the position above the heating plate 70. Then, after the next wafer W2 is cooled by the cooling operation of the cooling arm 80, the next wafer W2 is transferred to the transfer device (not shown) and collected (see FIG. 6(e)).

In the heat treatment device 50 in accordance with the first illustrative embodiment, the transfer arm 61 receives the wafer W1 from the transfer device and transfers the received wafer W1 to the heating plate 70. Then, while the wafer W1 previously heat-treated by the heating plate 70 is transferred to the transfer device, the receiving operation of the heat-treated wafer W1 from the heating plate 70 by the transfer arm 61 and the transferring operation of the next wafer W2 to the heating plate 70 by the cooling arm 80 serving as the substrate holding unit can be performed consecutively. The heat-treated wafer W1 can be transferred to the transfer device after cooled by the transfer arm 61 having the cooling operation, and the heat-treated wafer W2 can be transferred to the transfer device after cooled by the cooing arm 80. In this way, by adding the cooling operation for cooling the wafer W during the heat treatment by the heating plate 70, operation efficiency can be improved.

Second Illustrative Embodiment

A heat treatment device 50A in accordance with a second illustrative embodiment includes a cooling arm 80A serving as a substrate holding unit configured to be movable between a position above the heating plate 70 and the cover body 73 and a position above the standby position of the transfer arm 61. While the wafer W1 previously heat-treated by the heating plate 70 is transferred to the transfer device, the cooling arm 80A is configured to cool the heat-treated wafer W1 and allow the transfer arm 61 to transfer the next wafer W2 to the heating plate 70.

Figure 7:
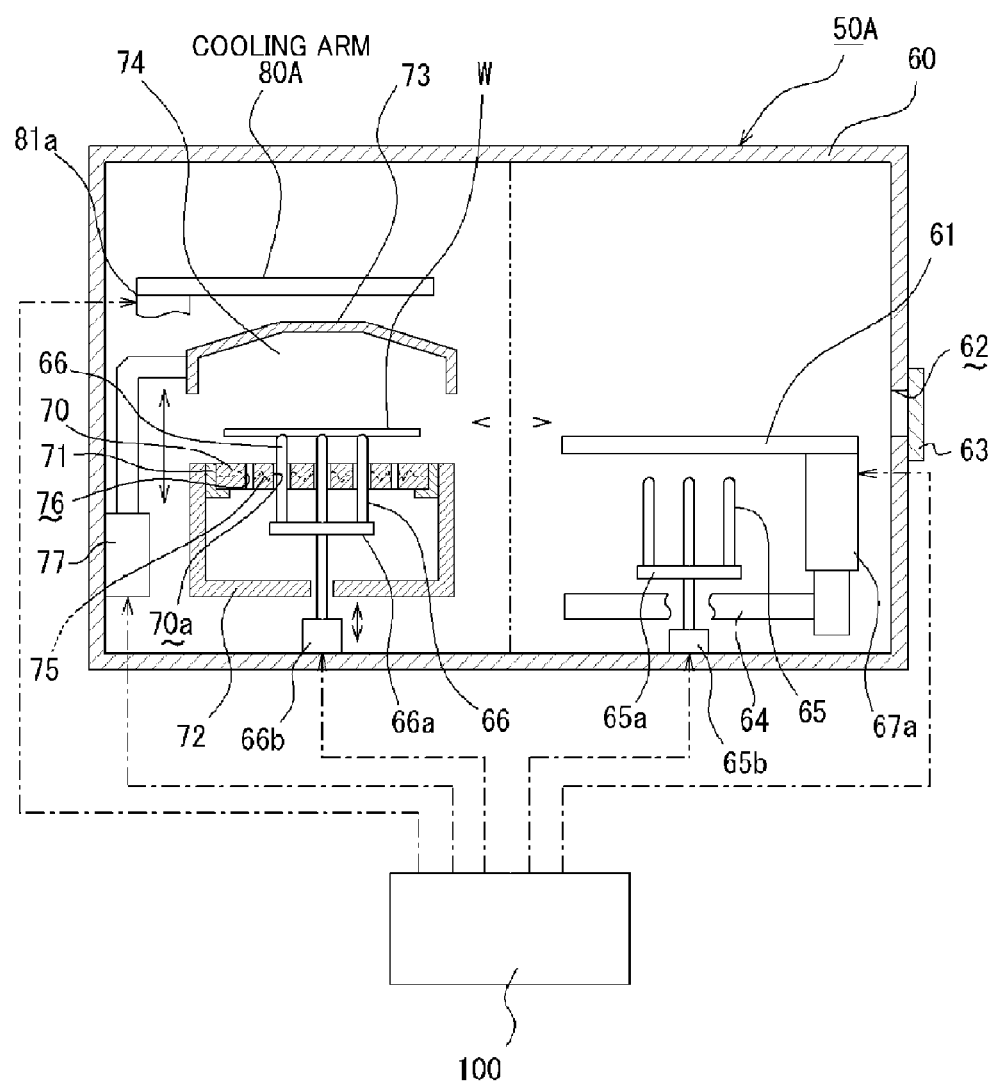
FIG. 7 is a longitudinal cross sectional view schematically illustrating a substrate heat treatment device in accordance with a second illustrative embodiment.
Figure 8:
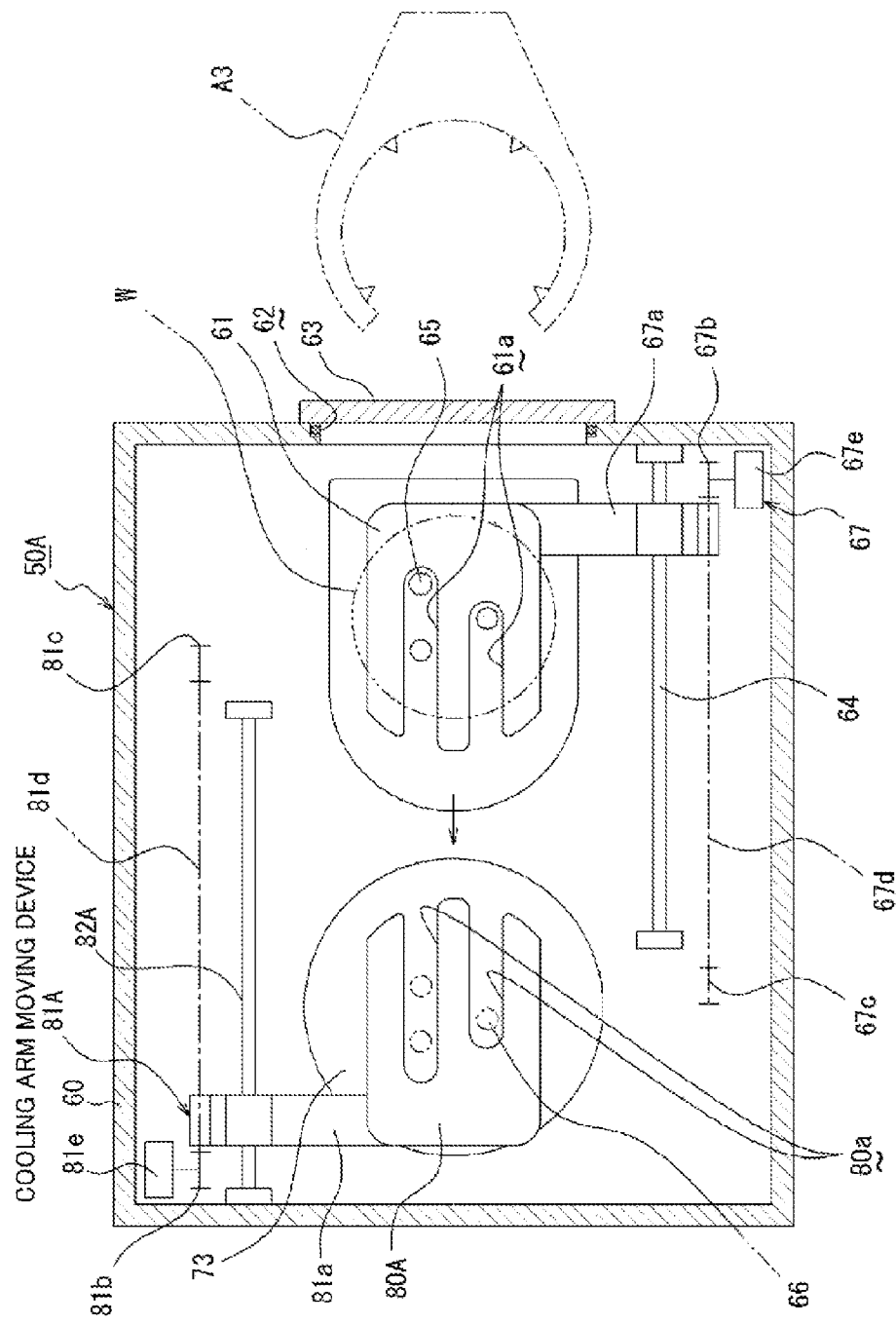
FIG. 8 is a transversal cross sectional view schematically illustrating the substrate heat treatment device in accordance with the second illustrative embodiment.

The heat treatment device 50A in accordance with the second illustrative embodiment includes, as illustrated in FIGS. 7 and 8, includes the cooling arm 80A as the substrate holding unit configured to be movable between a position above the heating plate 70 and the cover body 73 and a position above the standby position of the transfer arm 61.

As shown in FIG. 8, for example, the cooling arm 80A has the substantially rectangular shape and its side surface facing the standby position of the transfer arm 61 has an arc shape gently curved protrudingly toward the standby position of the transfer arm 61. Within the cooing arm 80A, for example, a non-illustrated cooling flow passage for allowing a coolant to flow therethrough is included, and the cooling arm 80A is controlled to be at a certain cooling temperature, e.g., about 23° C. by the cooling flow passage. As shown in FIG. 8, for example, a rail 82A extended in the X direction is provided at a side of the cooling arm 80A. The cooling arm 80A is configured to be moved along the rail 82A by a cooling arm moving device 81A while being moved between the position above the heating plate 70 and the cover body 73 and the position above the standby position of the transfer arm 61 forward and backward. The cooling arm moving device 81A has the same element as that of the transfer arm moving device 67.

In this case, as depicted in FIG. 8, the bracket 81a, which is protruded at a base end portion (left side in FIG. 8) of the cooling arm 80A, is slidably provided at the rail 82A. The bracket 81a is connected to the timing belt 81d provided between the driving pulley 81b and the driven pulley 81c that constitute the cooling arm moving device 81A. By rotating the driving pulley 81b forward and backward by the driving motor 81e, the cooling arm 80A can be reciprocated between the position above the heating plate 70 and the cover body 73 and the position above the standby position of the transfer arm 61 beside the heating plate 70. Further, the cooling arm moving device 81A may be formed of the ball screw unit instead of the timing belt unit.

Further, as shown in FIG. 8, the cooling arm 80A also has two slits 80a, as the same as the transfer arm 61. The slits 80a are extended from an end portion of the cooling arm 80A at the side of the transfer arm 61 located at the standby position toward a central portion of the cooling arm 80A. The slits 80a allow the cooling arm 80A not to interfere with the arm lifting pins 65 when the cooling arm 80A is moved to the position above the standby position of the transfer arm 61.

In accordance with the second illustrative embodiment, the cooling arm moving device 81A is electrically connected to the controller 100 as a control unit, and an operation thereof is controlled in response to control signals based on a program stored in the controller 100.

Further, the configuration of the heat treatment device 50A in accordance with second illustrative embodiment is the same as that of the heat treatment device 50 in the first illustrative embodiment excepting that only one loading/unloading opening 62 and only one shutter 63 for opening and closing the loading/unloading opening 62 are provided at a sidewall of a housing 60. Thus, same parts will be assigned same reference numerals, and redundant description will be omitted.

Figure 9:
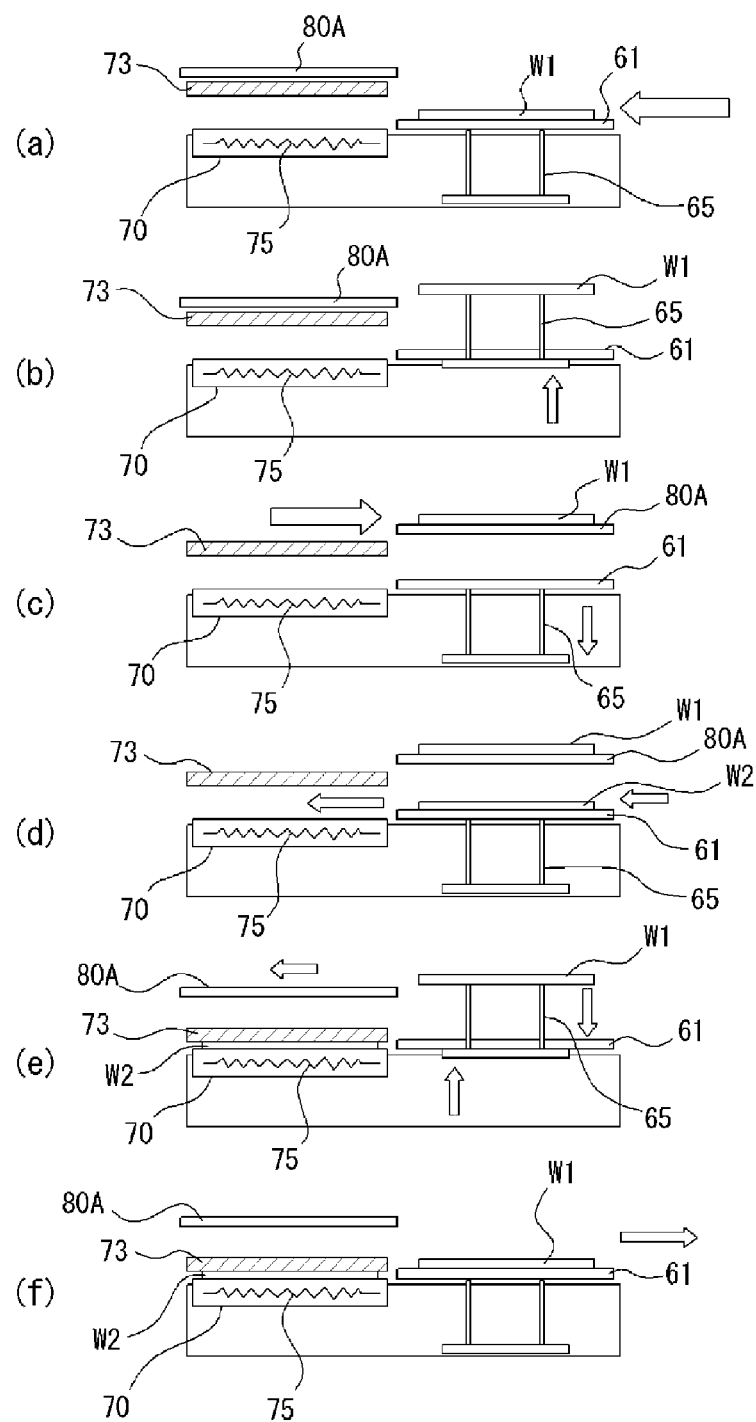
FIG. 9 is a side view schematically illustrating an operation of the substrate heat treatment device in accordance with the second illustrative embodiment.

Now, an operation of the heat treatment device 50A in accordance with the second illustrative embodiment will be described in detail with reference to FIG. 9. First, a wafer W1 is transferred to a position above the transfer arm 61 located at the standby position by a transfer device (not shown) that enters into the heat treatment device 50A through the loading/unloading opening 62, and the transfer arm 61 receives the wafer W1 (see FIG. 9(a)).

Subsequently, the transfer arm 61 is moved to a position above the heating plate 70, and the heating plate lifting pins 66 are moved up and receive the wafer W1 from the transfer arm 61. Then, the transfer arm 61 is retreated, and the heating plate lifting pins 66 are moved down so that the wafer W1 is mounted on the heating plate 70. After the transfer arm 61 that has transferred the wafer W1 to the heating plate 70 is retreated to the standby position, the cover body 73 is moved down and the wafer W1 is heat-treated.

Upon the completion of the heat treatment by the heating plate 70, the cover body 73 is moved up. The heating plate lifting pins 66 are moved up and the previously heat-treated wafer W1 is transferred on the transfer arm 61 that is moved to the position above the heating plate 70. After the transfer arm 61 receiving the heat-treated wafer W1 is moved to the standby position, the arm lifting pins 65 are moved up and the heat-treated wafer W1 is transferred to a position above the standby position of the transfer arm 61 (see FIG. 9(b)).

In this state, the cooling arm 80A is moved to the position above the standby position of the transfer arm 61 so as to be located under the wafer W1 moved up by the arm lifting pins 65. Then, the arm lifting pins 65 are moved down, and the cooling arm 80A receives and cools the wafer W1 (see FIG. 9(c)). At this time, a next wafer W2 is transferred to the position above the transfer arm 61 located at the standby position by the transfer device (not shown), and then, the transfer arm 61 receives the next wafer W2 (see FIG. 9(d)).

Thereafter, the transfer arm 61 is moved to the position above the heating plate 70. The heating plate lifting pins 66 are moved up and receive the next wafer W2 from the transfer arm 61. Then, the transfer arm 61 is retreated and the heating plate lifting pins 66 are moved down so that the next wafer W2 is mounted on the heating plate 70. After the transfer arm 61 that has transferred the next wafer W2 to the heating plate 70 is retreated to the standby position, the cover body 73 is moved down, and the next wafer W2 is heat-treated. While the next wafer W2 is heat-treated, the wafer W1 cooled by the cooling arm 80A is located at the position above the cooling arm 80A by moving up the arm lifting pins 65. Then, after the cooling arm 80A is retreated to the position above the heating plate 70 and the cover body 73, the arm lifting pins 65 are moved down and the wafer W1 is transferred on the transfer arm 61 located at the standby position (see FIG. 9(e)). Afterward, the wafer W1 is transferred to the transfer device (not shown) and collected (see FIG. 9(f)).

In the heat treatment device 50A in accordance with the second illustrative embodiment, the transfer arm 61 receives the wafer W1 from the transfer device and transfers the received wafer W1 to the heating plate 70. Then, while the wafer W1 previously heated by the heating plate 70 is transferred to the transfer device, the cooling arm 80A as the substrate holding unit receives the wafer W1 from the transfer arm 61 and cools the wafer W1, and the transfer arm 61 receives the next wafer W2 from the transfer device and transfers the next wafer W2 to the heating plate 70. Thereafter, the transfer arm 61 can transfer the wafer W1 cooled by the cooling arm 80A to the transfer device. As in this illustrative embodiment, by adding the cooling operation for cooling the wafer W during the heat treatment by the heating plate 70, the operation efficiency can be improved.

Third Illustrative Embodiment

In a heat treatment device 50B in accordance with a third illustrative embodiment, while the previously heat-treated wafer W1 is transferred to the transfer device, the heat-treated wafer W1 is cooled by a retreat buffer 85 as a substrate holding unit and the next wafer W2 is transferred to the heating plate 70 by the transfer arm 61. The retreat butter 85 is configured to be movable between the transfer arm 61 located at the standby position and the position above the transfer arm 61.

Figure 10:
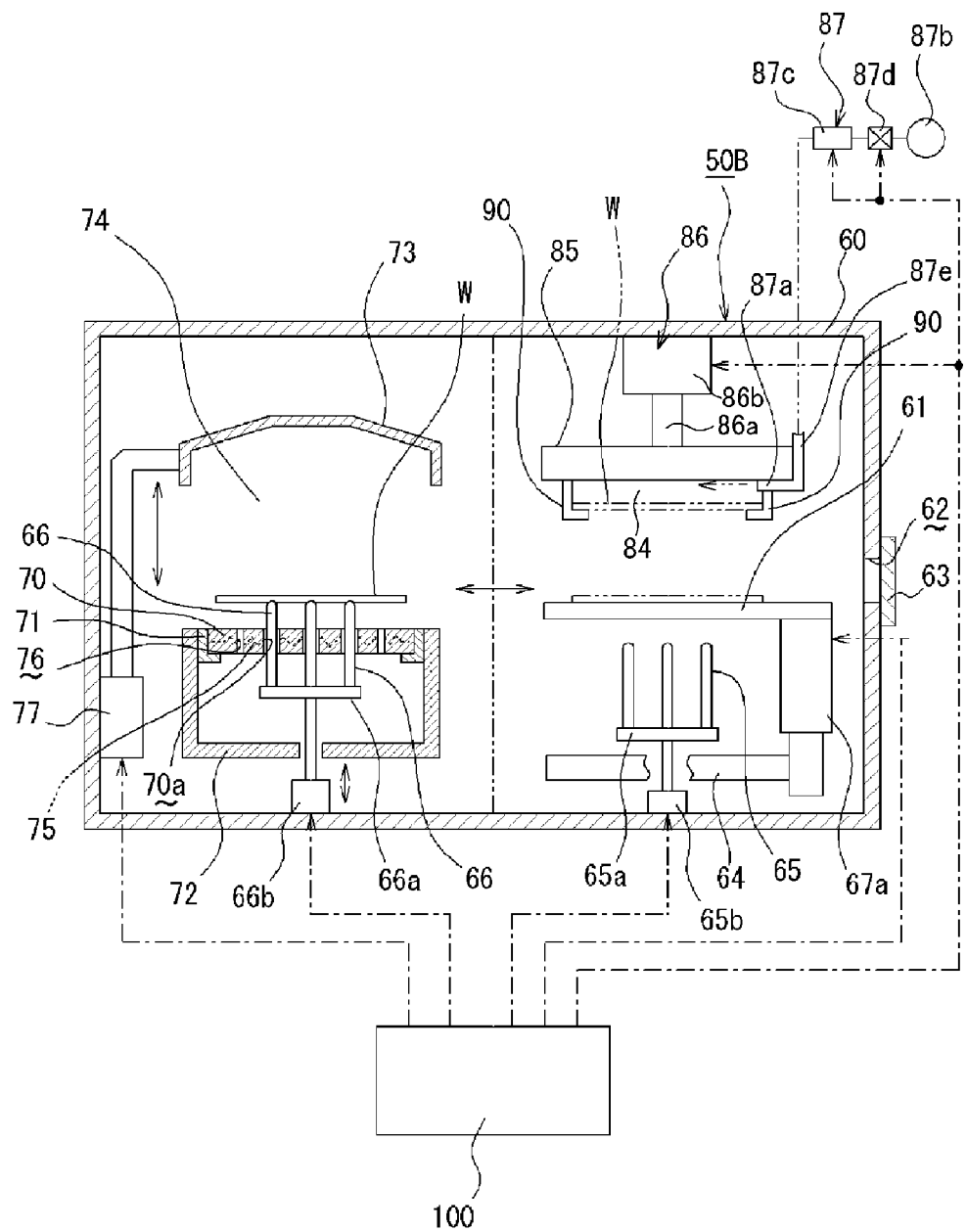
FIG. 10 is a longitudinal cross sectional view schematically illustrating a substrate heat treatment device in accordance with a third illustrative embodiment.
Figure 13:
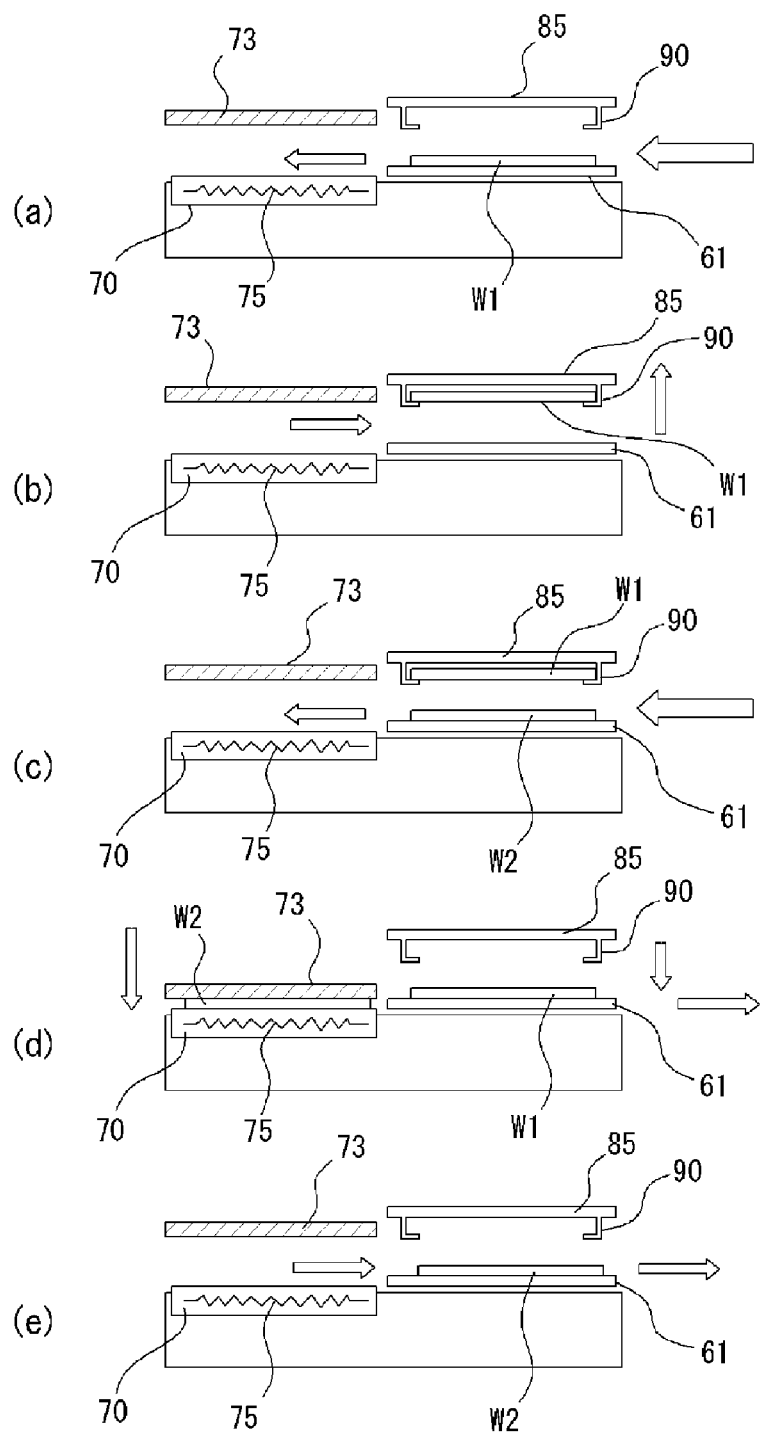
FIG. 13 is a side view schematically illustrating an operation of the substrate heat treatment device in accordance with the third illustrative embodiment.

The heat treatment device 50B in accordance with the third illustrative embodiment includes, as illustrated in FIGS. 10 and 13, the retreat buffer 85 serving as the substrate holding unit configured to be movable between the transfer arm 61 located at the standby position and the position above the transfer arm 61.

The retreat buffer 85 is configured to be movable forward and backward between the position above the transfer arm 61 and the transfer arm 61 located at the standby position by a buffer elevation driving unit 86. Further, the retreat buffer 85 includes a substrate holding device 90 (hereinafter, simply referred to as a "holding device") for detachably holding the wafer W when the wafer W is transferred to/from the transfer arm 61; and a cooling device 87 for cooling the wafer W held by the holding device 90.

In such a configuration, e.g., as depicted in FIG. 10, the buffer elevation driving unit 86 is formed of an elevation cylinder 86*b* provided at a ceiling of the housing and extended downward. Further, the elevation cylinder 86*b* includes an elevation rod 86*a* connected to a top surface of the retreat buffer 85. The buffer elevation driving unit 86 may not be necessarily formed of the elevation cylinder 86*b* but may be formed of, but not limited to, a timing belt unit or a ball screw unit.

The cooling device 87, as depicted in FIG. 10, includes a gas supply nozzle 87*a*; and a gas supply pipe 87*e* connected between the gas supply nozzle 87*a* and a gas supply source 87*b*. The gas supply nozzle 87*a* is configured to discharge a gas such as a clean air or a nitrogen gas ($N_2$ gas) having a preset temperature of, e.g., about 23° C. toward a space 84 between a bottom surface of the retreat buffer 85 and a top surface of the wafer W held by the holding device 90. A temperature controller 87*c* and a flow rate control valve 87*d* are provided at the gas supply pipe 87*e*. The temperature controller 87*c* and the flow rate control valve 87*d* are electrically connected with the controller 100 and controlled based on a program stored in the controller 100.

With the cooling device 87 having the above-described configuration, the gas such as the clean air or the $N_2$ gas having the preset temperature of, e.g., about 23° C. is discharged toward the space 84 between the bottom surface of the retreat buffer 85 and the top surface of the wafer W held by the holding device 90. Accordingly, the heat-treated wafer W temporarily held by the retreat buffer 85 can be cooled.

Figure 11:
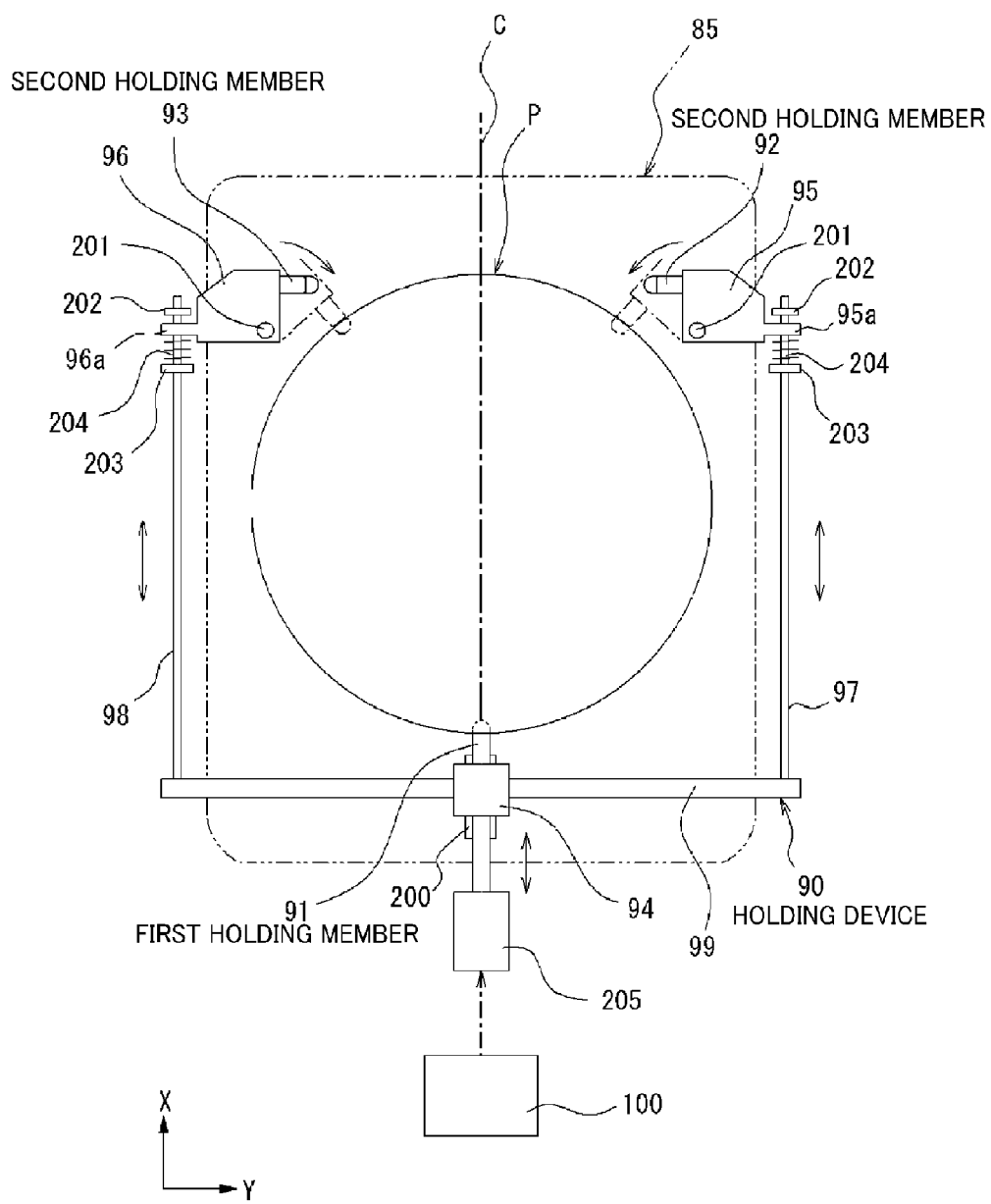
FIG. 11 is a plane view schematically illustrating a substrate holding device of the substrate heat treatment device in accordance with the third illustrative embodiment.
Figure 12:
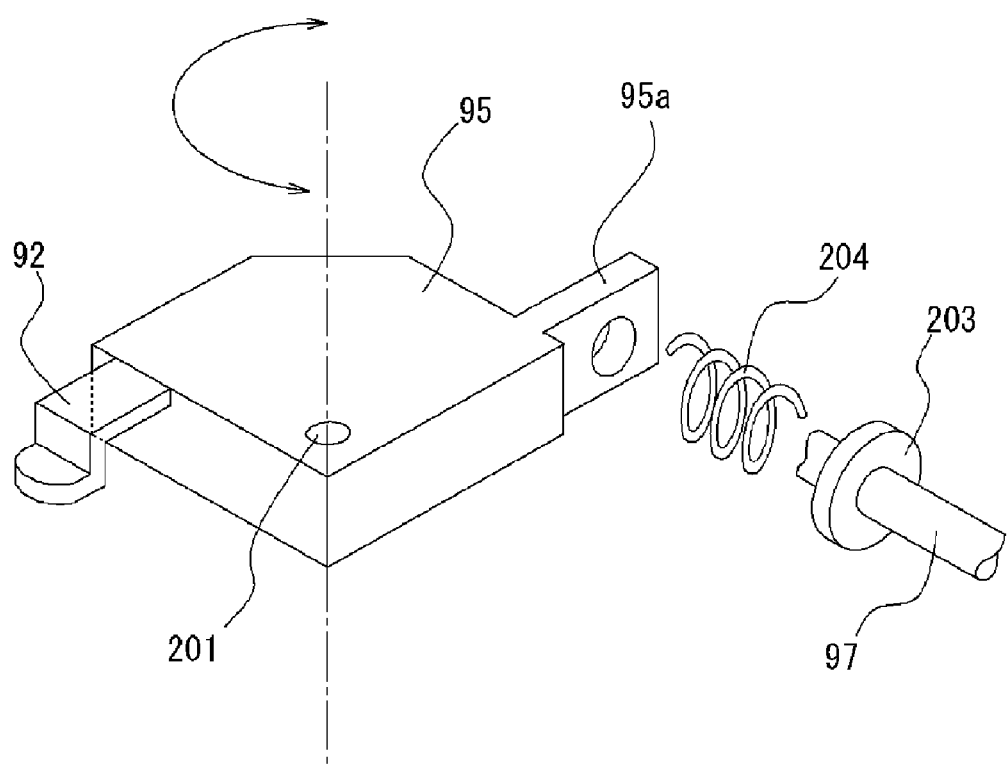
FIG. 12 is an exploded perspective view illustrating a major portion of the substrate holding device.

Meanwhile, the holding device 90 mainly includes, as depicted in FIGS. 11 and 12, a first holding member 91 and two second holding members 92 and 93, a linearly moving guide 94, rotatable brackets 95 and 96, two linearly moving shaft 97 and 98, and a connection member 99. The first holding member 91 and the second holding members 92 and 93 are configured to hold side periphery portions of the wafer W and bottom surfaces of the side periphery portions thereof. The first holding member 91 is provided at the linearly moving guide 94, and the second holding members 92 and 93 are provided at the brackets 95 and 96, respectively. The two linearly moving shafts 97 and 98, which are in parallel with each other, connect the linearly moving guide 94 with the brackets 95 and 96. Further, the connection member 99 is connected to the two linearly moving shafts 97 and 98 perpendicularly.

The first holding member 91 holds the side periphery portion of the wafer W and the bottom surface of the side periphery portion thereof from the rear side of the retreat buffer 85 (from a negative X direction shown in FIG. 11). The second holding members 92 and 93 hold the side periphery portions of the wafer W and the bottom surfaces of the side periphery portions thereof from the front side of the retreat buffer 85 (from a positive X direction shown in FIG. 11). Each of the first and second holding members 91, 92, and 93 is made of a synthetic resin material having higher flexibility than the wafer W, and has a substantially crank shape having a vertical piece for holding the side periphery portion of the wafer W and a horizontal piece for holding the bottom surface of the side periphery portion of the wafer W.

The first holding member 91 is provided at the rear side of the retreat buffer 85 with respect to a holding position P, e.g., on a central line C passing through the center of the holding position P in the X direction. The first holding member 91 is provided at the linearly moving guide 94, and the linearly moving guide 94 is movable along a rail 200 provided on the central line C on the retreat butter 85. The first holding member 91 is movable in the X direction and is capable of holding the side periphery portion and the bottom surface of the side periphery portion of the wafer W from the negative X direction.

The second holding members 92 and 93 are provided at the rotatable brackets 95 and 96 provided at the front end portions of the retreat buffer 85 than the holding position P, respectively. The brackets 95 and 96 are positioned near both opposite end portions of the retreat buffer 85. By way of the example, the bracket 95 at which the second holding member 92 is provided is located at the side (right side in FIG. 11) of the retreat buffer 85 in a positive Y direction, whereas the bracket 96 at which the second holding member 93 is provided is located at the side (left side of FIG. 11) of the retreat buffer 85 in a negative Y direction.

Each of the brackets 95 and 96 has a substantially rectangular plate shape with its one corner slantly cut. By way of example, a pin 201 uprightly provided at the retreat buffer 85 penetrates a corner portion of each of the brackets 95 and 96 near the holding position P, and the brackets 95 and 96 are rotatable with respect to the retreat buffer 85. The second holding members 92 and 93 are provided at the brackets 95 and 96 to face each other with respect to the central line C. For example, the second holding member 92 and the second holding member 93 are positioned at a same distance from the central line C, and positions thereof for holding the wafer W on the holding position P are also symmetrical with respect to the central line C.

The brackets 95 and 96 are connected to the linearly moving guide 94 via the linearly moving shafts 97 and 98 connected to the brackets 95 and 96 and via the connection member 99.

The connection member 99 is extended in, e.g., the Y direction and provided at the linearly moving guide 94. As the linearly moving guide 94 is moved in the X direction, the connection member 99 is also moved in the X direction.

The two linearly moving shafts 97 and 98 are positioned at two opposite end portions of the retreat buffer 85. Two end portions of the connection member 99 are fixed to rear ends (negative X direction) of the linearly moving shafts 97 and 98, respectively, while front sides thereof (positive X direction) are connected to the brackets 95 and 96, respectively. With this configuration, the linearly moving shafts 97 and 98 are linearly moved in the X direction with the connection member 99, and these linear movements of the shafts 97 and 98 are converted to rotational movements of the brackets 95 and 96. As a result, the second holding members 92 and 93 are rotated by the linear movement of the first holding member 91.

As for connection portions between the linearly moving shafts 97 and 98 and the brackets 95 and 96, a connection portion between the linearly moving shaft 97 and the bracket 95 will be described as a representative example. For example, a protruding portion 95*a* is provided at a side of the bracket 95 opposite to the central line C, i.e., at the side end portion of the retreat buffer 85. A leading end portion of the linearly moving shaft 97 is movably inserted through the protruding portion 95*a* with an enough clearance. The linearly moving shaft 97 and the protruding portion 95*a* serve as a sliding pair. A first stopper 202 and a second stopper 203 are provided on the linearly moving shaft 97 with the protruding portion 95*a* therebetween. Provided between the second stopper 203 and the protruding portion 95a at the rear end side of the linearly moving shaft 97 is, e.g., a coil spring 204 as an elastic body. Accordingly, when the linearly moving shaft 97 is moved in the positive X direction, the second stopper 203 presses the coil spring 204 and the bracket 95 pressed by the coil spring 204 is rotated toward the inside of the retreat buffer 85, i.e., in a counterclockwise direction. Here, a rotation angle is set to be, e.g., about 10°. Further, when the linearly moving shaft 97 is moved in the negative X direction, the bracket 95 pressed by the first stopper 202 is rotated toward the outside of the retreat buffer 85, i.e., in a clockwise direction. Furthermore, for the connection portion between the linearly moving shaft 98 and the bracket 96, the linearly moving shaft 98 has the same configuration as that of the linearly moving shaft 97. That is, the linearly moving shaft 98 is inserted through a protruding portion 96a of the bracket 96, and the aforementioned first stopper 202, the second stopper 203, and the coil spring 204 are also provided in the same manner. Here, instead of the coil spring, e.g., sponge or rubber may be used as the elastic body.

Further, positions of the respective holding members 91, 92, and 93 are adjusted such that if the first holding member 91 is moved in the positive X direction and comes into contact with an edge of the holding position P (when viewed from a top), the second holding members 92 and 93 also come into contact with the edge of the holding position P. Accordingly, when the first holding member 91 and the second holding members 92 and 93 hold the wafer W at three points, the wafer W is aligned on the holding position P.

The linearly moving guide 94 is connected with, e.g., a cylinder 205, and the cylinder 205 is controlled by the controller 100. Accordingly, a moving distance of the linearly moving guide 94 in the X direction and timing for the movement can be controlled based on control signals from the controller 100. By way of example, the first holding member 91 and the second holding members 92 and 93 are operated according to a processing program of the controller 100. Instead of the cylinder 205, a motor may be used as a driving source of the linearly moving guide 94.

The other configuration of the third illustrative embodiment is the same as that of the first and second illustrative embodiments. The same parts will be assigned the same reference numerals, and redundant description will be omitted.

Now, an operation of the heat treatment device 50B in accordance with the third illustrative embodiment will be described in detail with reference to FIG. 13. First, a wafer W1 is transferred to a position above the transfer arm 61 located at the standby position by a transfer device (not shown) that enters into the heat treatment device 50B through the loading/unloading opening 62, and the transfer arm 61 receives the wafer W1 (see FIG. 13(a)).

Subsequently, the transfer arm 61 is moved to a position above the heating plate 70, and heating plate lifting pins 66 are moved up and receive the wafer W1 from the transfer arm 61. Then, the transfer arm 61 is retreated, and the heating plate lifting pins 66 are moved down so that the wafer W1 is located on the heating plate 70. After the transfer arm 61 that has transferred the wafer W1 to the heating plate 70 is retreated to the standby position, the cover body 73 is moved down and the wafer W1 is heat-treated.

Upon the completion of the heat treatment by the heating plate 70, the cover body 73 is moved up. The heat-treated wafer W1 is transferred on the transfer arm 61 that is moved to the position above the heating plate 70 by moving up the heating plate lifting pins 66. After the transfer arm 61 receiving the previously heat-treated wafer W1 is moved to the standby position, the retreat buffer 85 is moved down. Then, the heat-treated wafer W1 on the transfer arm 61 is held by the first and second holding members 91, 92, and 93 of the holding device 90, and the retreat buffer 85 is moved up to a position above the transfer arm 61. Then, by discharging cool air into the space 84 between the bottom surface of the retreat buffer 85 and the top surface of the wafer W1, the wafer W1 is pre-cooled (see FIG. 13(b)).

Thereafter, a next wafer W2 is transferred to the position above the transfer arm 61 located at the standby position by the transfer device (not shown) enters into the heat treatment device 50B through the loading/unloading opening 62, and the transfer arm 61 receives the next wafer W2 (see FIG. 13(c)).

Afterward, the transfer arm 61 is moved to the position above the heating plate 70. Then, after the heating plate lifting pins 66 are moved up and receive the next wafer W2 from the transfer arm 61, the transfer arm 61 is retreated and the heating plate lifting pins 66 are moved down so that the next wafer W2 is mounted on the heating plate 70. After the transfer arm 61 that has transferred the next wafer W2 to the heating plate 70 is retreated to the standby position, the retreat buffer 85 is moved down and transfers the wafer W1 on the transfer arm 61. Then, the retreat buffer 85 is moved up (see FIG. 13(d)). The wafer W1 on the transfer arm 61 is cooled by the transfer arm 61 and, then, transferred to the transfer device (not shown) and collected.

Upon the completion of the heat treatment on the next wafer W2, the cover body 73 is moved up, and the heating plate lifting pins 66 are moved up so that the next wafer W2 is located at the position above the heating plate 70. At this time, the transfer arm 61 is moved to the position above the heating plate 70, and the heating plate lifting pins 66 are moved down so that the next wafer W2 is mounted on the transfer arm 61. After the transfer arm 61 receiving the next wafer W2 is retreated to the standby position, the transfer arm 61 cools the next wafer W2 (see FIG. 13(e)). Thereafter, the cooled wafer W2 is transferred to the transfer device (not shown) and collected.

In the heat treatment device 50B in accordance with the above-described third illustrative embodiment, the transfer arm 61 receives the wafer W1 from the transfer device and transfers the received wafer W1 to the heating plate 70. Then, while the wafer W1 heat-treated by the heating plate 70 is transferred to the transfer device, the retreat buffer 85 as the substrate holding unit receives the heat-treated wafer W1 from the transfer arm 61 and preliminarily cools the wafer W1, and the transfer arm 61 receives the next wafer W2 from the transfer device and transfers the next wafer W2 to the heating plate 70. Thereafter, the transfer arm 61 receives and cools the wafer W1 preliminarily cooled by the retreat buffer 85 and transfers the wafer W1 to the transfer device. Accordingly, by adding the cooling operation for cooling the wafer W during the heat treatment by the heating plate 70, the operation efficiency can be improved.

Another Illustrative Embodiment

In the first illustrative embodiment, the cooling arm is disposed above the transfer arm 61. However, as illustrated in FIG. 14, for example, a transfer arm 61B and a cooling arm 80B may be positioned opposite to each other with the heating plate 70 therebetween. In this configuration, the wafer W is transferred between the transfer arm 61B and the cooling arm 80B by a transfer device 400. The transfer device 400 is configured to be horizontally movable in X and Y directions, vertically movable in a Z direction, and also rotatable in a θ direction.

In this configuration, notches 300 are formed at three different positions at the outer periphery of each of the transfer arm 61B and the cooling arm 80B. The transfer device 400 has holding claws 401 at positions corresponding to the three notches 300, and the holding claws 401 can be inserted into the notches 300. Further, by forming the same notches 300 at the outer periphery of the heating plate 70 as well, the wafer W can be transferred to the heating plate 70 by the transfer device 400.

Further, each of the transfer arm 61B and the cooling arm 80B is configured to be movable between the position above the heating plate 70 and the standby positions apart from the heating plate 70 by a non-illustrated arm moving device. Moreover, as stated above, the heating plate 70 is provided with heating plate lifting pins 66 capable of being moved up and down by an elevation driving unit (not shown). In order to prevent the transfer arm 61B and the cooling arm 80B from interfering with the heating plate lifting pins 66, the transfer arm 61B has two slits 61a extended from an end portion of the transfer arm 61B at the side of the heating plate 70 toward a central portion thereof. Further, the cooling arm 80B has two slits 80a extended from an end portion of the cooling arm 80B at the side of the heating plate 70 toward a central portion thereof.

Further, the above illustrative embodiments have been described when using a semiconductor wafer as a processing target substrate. However, the illustrative embodiments are not limited thereto, but may be also applicable to a heat treatment device for performing a heat treatment on various other types of substrate, such as a substrate for a flat display or a photomask substrate.

What is claimed is:

1. A substrate heat treatment device comprising:
    a heating plate that mounts thereon a substrate and performs a heat treatment on the substrate;
    a substrate transfer arm that transfers the substrate to the heating plate and is movable from and toward the heating plate;
    an arm moving device that moves the substrate transfer arm between a position above the heating plate and a standby position of the substrate transfer arm apart from the heating plate;
    a substrate cooling arm that is disposed above the substrate transfer arm and transfers the substrate to the heating plate and is movable from and toward the heating plate;
    a cooling arm moving device that moves the substrate cooling arm between the position above the heating plate and a standby position of the substrate cooling arm apart from the heating plate;
    a substrate transfer device that transfers the substrate to and from the substrate transfer arm or the substrate cooling arm located at the standby position of the substrate transfer arm or the substrate cooling arm;
    a controller that controls the arm moving device and the cooling arm moving device; and
    a housing comprising a top wall, a bottom wall, and a plurality of sidewalls positioned between the top wall and the bottom wall, the housing configured to accommodate therein the heating plate, the substrate transfer arm, the arm moving device, the substrate cooling arm and the cooling arm moving device,
    wherein the controller is configured to control the arm moving device and the cooling arm moving device to allow the substrate transfer arm to transfer a first substrate previously heat-treated on the heating plate to the standby position of the substrate transfer arm, and simultaneously to allow the substrate cooling arm to transfer a second substrate to be heat-treated to the heating plate,
    the arm moving device includes a first rail fixed to a first side of one of the plurality of sidewalls of the housing,
    the cooling arm moving device includes a second rail fixed to a second side of said one of the plurality of sidewalls of the housing such that the first and second rails are disposed on opposite sides of the heating plate,
    the substrate transfer arm extends inwardly towards the heating plate from the first rail and the substrate cooling arm extends inwardly towards the heating plate from the second rail, and
    the first and second rails are parallel to each other.

2. The substrate heat treatment device of claim 1,
    wherein the substrate transfer arm is configured to cool the first substrate, and
    the substrate cooling arm is configured to cool the second substrate.

3. The substrate heat treatment device of claim 2, further comprising:
    a heating plate lifting pin configured to be protruded above and retracted below a surface of the heating plate and configured to be capable of transferring the substrate to and from the substrate transfer arm and the substrate cooling arm; and
    an elevation driving unit configured to move the heating plate lifting pin up and down,
    wherein the heating plate lifting pin and the elevation driving unit are provided at a region where the heating plate is located.

* * * * *

UNITED STATES PATENT AND TRADEMARK OFFICE
CERTIFICATE OF CORRECTION

PATENT NO. : 9,463,938 B2
APPLICATION NO. : 13/592536
DATED : October 11, 2016
INVENTOR(S) : Akihiro Toyozawa It is certified that error appears in the above-identified patent and that said Letters Patent is hereby corrected as shown below:

In the Specification

Column 9, Line 64, insert -- 70 -- after "plate".

Column 13, Line 6, insert -- 60 -- after "housing".

Column 16, Line 61, insert -- 80 -- after "arm".

Signed and Sealed this
Tenth Day of January, 2017

Michelle K. Lee
*Director of the United States Patent and Trademark Office*